United States Patent
Hsieh et al.

(10) Patent No.: US 11,877,421 B2
(45) Date of Patent: Jan. 16, 2024

(54) COOLING LIQUID FLOW CONTROL DEVICE

(71) Applicants: Inventec (Pudong) Technology Corporation, Shanghai (CN); INVENTEC CORPORATION, Taipei (TW)

(72) Inventors: Han Chih Hsieh, Taipei (TW); Hsiu-Hui Kuo, Taipei (TW); Yang Chang Su, Taipei (TW); Chih Hung Cheng, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 197 days.

(21) Appl. No.: 17/643,172

(22) Filed: Dec. 7, 2021

(65) Prior Publication Data
US 2023/0156956 A1 May 18, 2023

(30) Foreign Application Priority Data
Nov. 12, 2021 (CN) .......................... 202111338474.3

(51) Int. Cl.
- *F28D 21/00* (2006.01)
- *H01L 23/40* (2006.01)
- *H05K 7/20* (2006.01)
- *G06F 1/20* (2006.01)

(52) U.S. Cl.
CPC ......... *H05K 7/20263* (2013.01); *G06F 1/206* (2013.01); *H05K 7/20272* (2013.01); *H05K 7/20281* (2013.01)

(58) Field of Classification Search
CPC . H05K 7/20281; H01L 23/4006; H01L 23/40; H01L 2023/4081; H01L 2023/4075; F28D 2021/0029
See application file for complete search history.

(56) References Cited

U.S. PATENT DOCUMENTS

| | | | | |
|---|---|---|---|---|
| 6,498,725 B2* | 12/2002 | Cole | ..................... | F25B 39/028 165/104.31 |
| 2004/0112585 A1* | 6/2004 | Goodson | ............... | F04B 19/006 165/80.4 |
| 2011/0100597 A1* | 5/2011 | Wang | .................... | H01L 23/473 165/185 |

(Continued)

*Primary Examiner* — Frantz F Jules
*Assistant Examiner* — Jason N Thompson
(74) *Attorney, Agent, or Firm* — CKC & Partners Co., LLC

(57) ABSTRACT

A cooling liquid flow control device includes a heat dissipation bottom plate, a fixing holder, a cooling module, and a temperature control element. The heat dissipation bottom plate has a bottom surface configured to be in contact with a heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is connected to the cooling module and includes a valve. The valve is configured to reciprocally move based on a temperature of the heating element, thereby adjusting a flow rate of the cooling liquid in and out of the cavity.

7 Claims, 8 Drawing Sheets

(56) References Cited

U.S. PATENT DOCUMENTS

| | | | | |
|---|---|---|---|---|
| 2016/0183409 A1* | 6/2016 | Zhou | ............... | H05K 7/20263 |
| | | | | 165/104.31 |
| 2016/0190038 A1* | 6/2016 | Koyama | ............ | H05K 7/20927 |
| | | | | 165/80.4 |
| 2019/0295924 A1* | 9/2019 | Kawase | ............... | H01L 25/07 |
| 2019/0387636 A1* | 12/2019 | Schwarz | ............. | H01L 33/648 |
| 2020/0110448 A1* | 4/2020 | Lee | ............... | H05K 7/20272 |

* cited by examiner

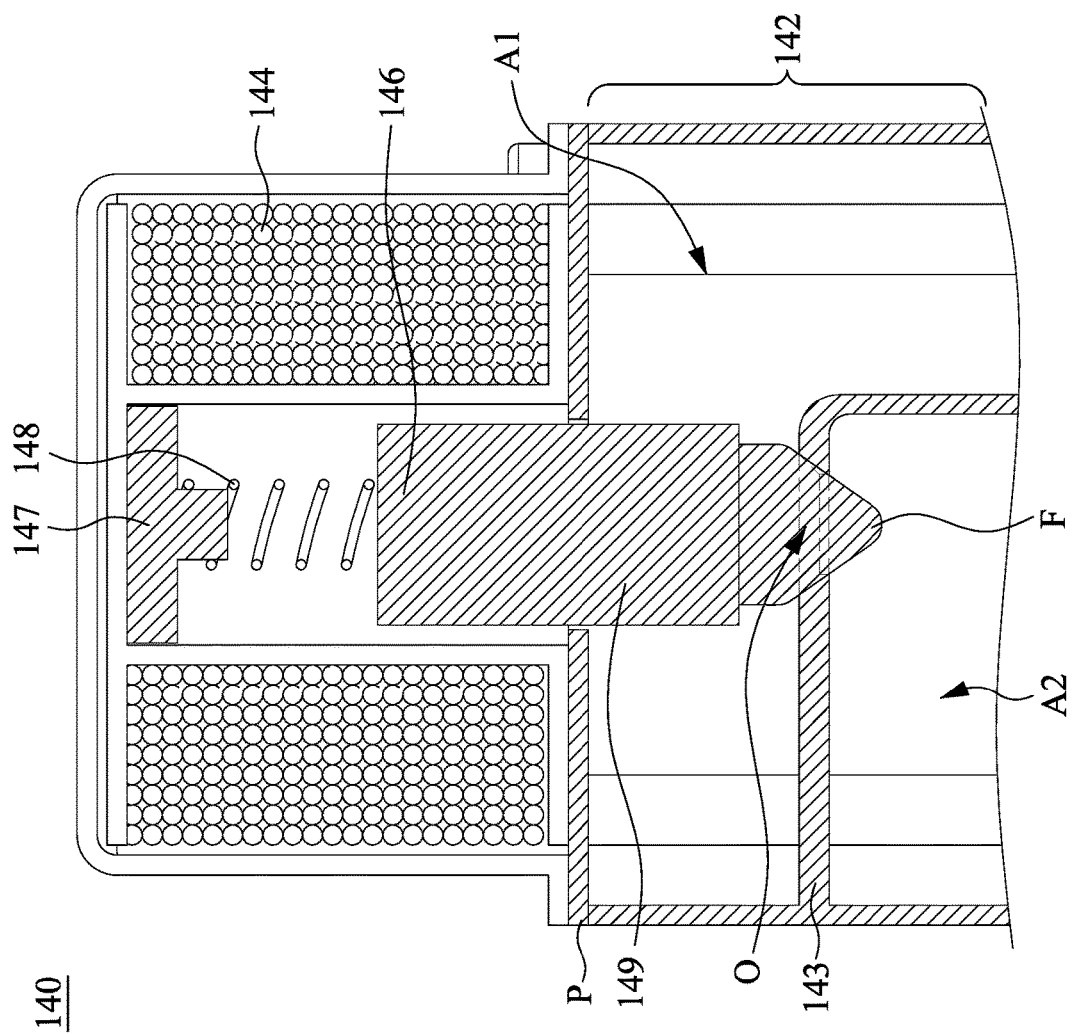

COOLING LIQUID FLOW CONTROL DEVICE

CROSS-REFERENCE TO RELATED APPLICATION

This application claims priority to China Application Serial Number 202111338474.3, filed Nov. 12, 2021, which is herein incorporated by reference in its entirety.

BACKGROUND

Field of Invention

The present disclosure relates to a cooling liquid flow control device.

Description of Related Art

A conventional water-cooling module for a electronic component (for example, CPU) uses a thermally conductive substrate as the substrate, cooperates with the water inlet side and the water outlet side as the internal circulation loop for heat exchange to achieve the effect of heat dissipation for the electronic component, and utilizes the hole corresponding to the electronic component platform to perform the fixation on the printed circuit board (PCB).

However, the conventional water-cooling module does not have the function of controlling the flow rate (for example, the flow rate of the cooling water). Since the water-cooling module cannot control the flow rate, the water-cooling module cannot optimize the heat dissipation of the electronic components in the idle or full load state, and thus cannot adjust the electrical load of the cooling distribution unit (CDU) to the system.

Therefore, how to propose a cooling liquid flow control device that can solve the aforementioned problems is one of the problems that the industry urgently wants to invest in research and development resources to solve.

SUMMARY

In view of this, one purpose of present disclosure is to provide a cooling liquid flow control device that can solve the aforementioned problems.

In order to achieve the above objective, according to one embodiment of the present disclosure, a cooling liquid flow control device includes a heat dissipation bottom plate, a fixing holder, a cooling module, and a temperature control element. The heat dissipation bottom plate has a bottom surface configured to be in contact with the heating element on a substrate. The fixing holder is connected to the heat dissipation bottom plate and configured to be fixed with the substrate. The cooling module is connected to a top surface of the heat dissipation bottom plate to form a cavity. The cavity is configured to circulate a cooling liquid. The temperature control element is connected to the cooling module and includes a valve. The valve is configured to reciprocally move based on a temperature of the heating element, thereby adjusting a flow rate of the cooling liquid in and out of the cavity.

In one or more embodiments of the present disclosure, the cooling module includes a liquid inlet pipe and a liquid outlet pipe. The cavity further includes a first sub-cavity and a second sub-cavity. The first sub-cavity is configured to receive the cooling liquid from the liquid inlet pipe. The second sub-cavity is configured to deliver the cooling liquid from the first sub-cavity to the liquid outlet pipe.

In one or more embodiments of the present disclosure, the cooling module further includes a top plate, a side wall, and a separating wall. The top plate has a liquid inlet hole and a liquid outlet hole. The liquid inlet hole is connected between the first sub-cavity and the temperature control element. The liquid outlet hole is connected between the temperature control element and the second sub-cavity. The side wall extends vertically from an edge of the top plate and surrounds the edge of the top plate. The side wall is connected to the heat dissipation bottom plate. The separating wall extends vertically from the top plate and separates the first sub-cavity and the second sub-cavity. The separating wall is connected to the heat dissipation bottom plate.

In one or more embodiments of the present disclosure, the temperature control element further includes a chamber body and a coil. The chamber body is configured to accommodate the cooling liquid from the first sub-cavity. The coil is connected to the chamber body and surrounds the valve.

In one or more embodiments of the present disclosure, the chamber body includes a liquid inlet area, a liquid outlet area, and a spacer. The liquid inlet area is configured to receive the cooling liquid from the first sub-cavity. The liquid outlet area is configured to deliver the cooling liquid from the liquid inlet area to the second sub-cavity. The spacer separates the liquid inlet area and the liquid outlet area and has an opening. The opening enables the cooling liquid to circulate between the liquid inlet area and the liquid outlet area.

In one or more embodiments of the present disclosure, the valve is configured to clog and be separated from the opening.

In one or more embodiments of the present disclosure, the cooling liquid flow control device further includes a processing unit. The processing unit is configured to receive a signal of the temperature of the heating element. The processing unit is further configured to convert the signal to a current output to the coil, wherein the current causes a displacement of the valve.

In one or more embodiments of the present disclosure, the flow rate of the cooling liquid changes based on the displacement of the valve, and the flow rate and the current are in a linear relationship.

In one or more embodiments of the present disclosure, the valve is configured to clog the opening so as not to communicate the liquid inlet area and the liquid outlet area when the heating element is in an idle state.

In one or more embodiments of the present disclosure, the temperature control element is configured to be separated from the opening so as to communicate the liquid inlet area and the liquid outlet area when the heating element is in a load state.

In summary, in the cooling liquid flow control device of the present disclosure, since the temperature control element utilizes the characteristic that the valve can reciprocally move based on the temperature of the heating element, the valve can clog, partially clog, or be separated from the opening to achieve the purpose of controlling the flow rate of the cooling liquid. In the cooling liquid flow control device of the present disclosure, since the flow rate of the cooling liquid that changes based on the displacement generated by the valve has a linear relationship with the current, the valve can proportionally clog the opening based on the temperature of the heating element. In this way, the energy saving effect of the cooling liquid flow control device can be achieved.

The above-mentioned description is only used to explain the problem to be solved by the present disclosure, the technical means to solve the problem, and the effects produced, etc. The specific details of the present disclosure will be well discussed in the following embodiments and related drawings.

BRIEF DESCRIPTION OF THE DRAWINGS

In order to make the above and other objectives, features, advantages and examples of the present disclosure more obvious, the description of the accompanying drawings is as follows:

FIG. 5 shows a partial cross-sectional view of a temperature control device in accordance with an embodiment of present disclosure;

DETAILED DESCRIPTION

Figure 1:
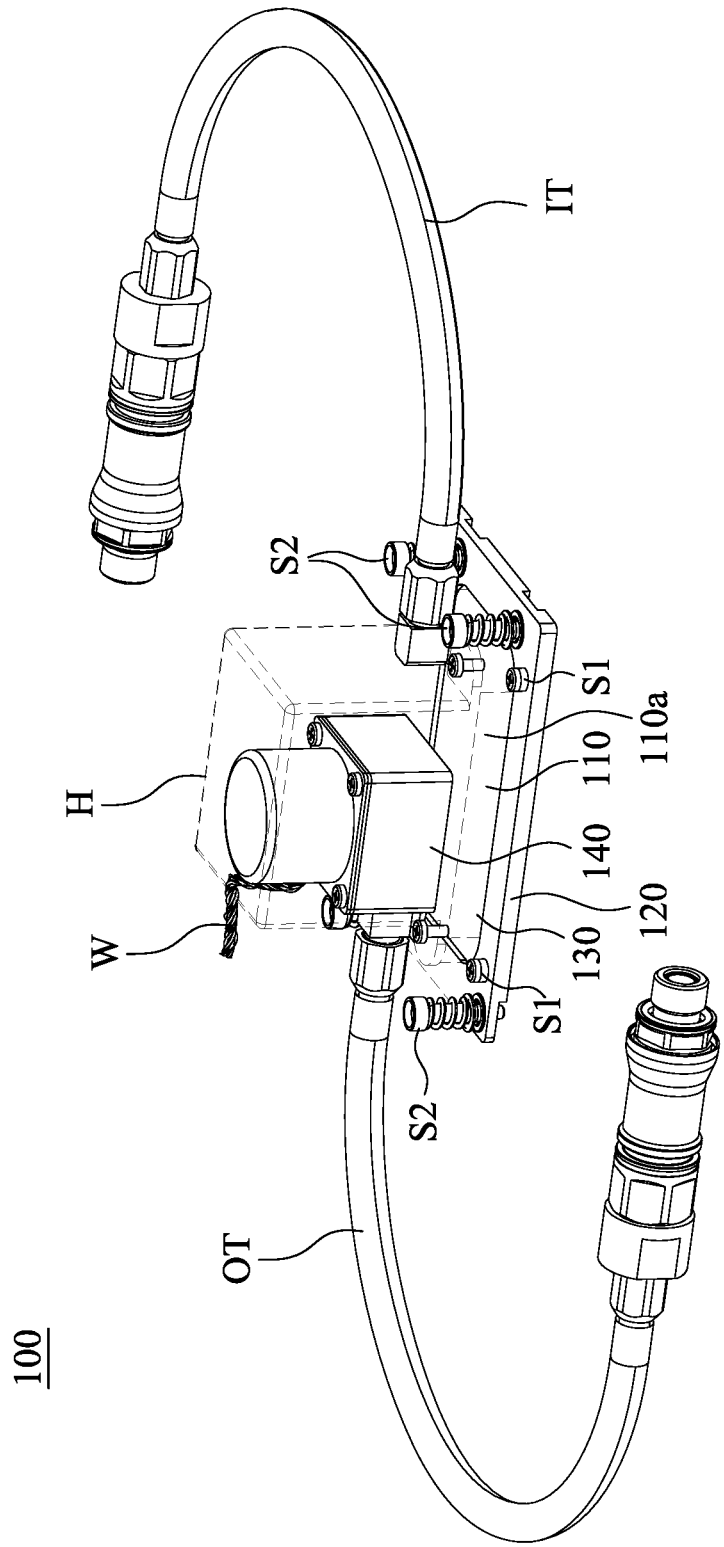
FIG. 1 shows a schematic view of a cooling liquid flow control device in accordance with an embodiment of present disclosure.

Hereinafter, a plurality of embodiments of the present disclosure will be disclosed in diagrams. For clarity of discussion, many details in practice will be described in the following description. However, it should be understood that these details in practice should not limit present disclosure. In other words, in some embodiments of present disclosure, these details in practice are unnecessary. In addition, for simplicity of the drawings, some conventionally used structures and elements will be shown in a simple schematic manner in the drawings. The same reference numbers are used in the drawings and the description to refer to the same or like parts.

Hereinafter, the structure and function of each component included in a cooling liquid flow control device 100 of this embodiment and the connection relationship between the components will be described in detail.

Figure 2:
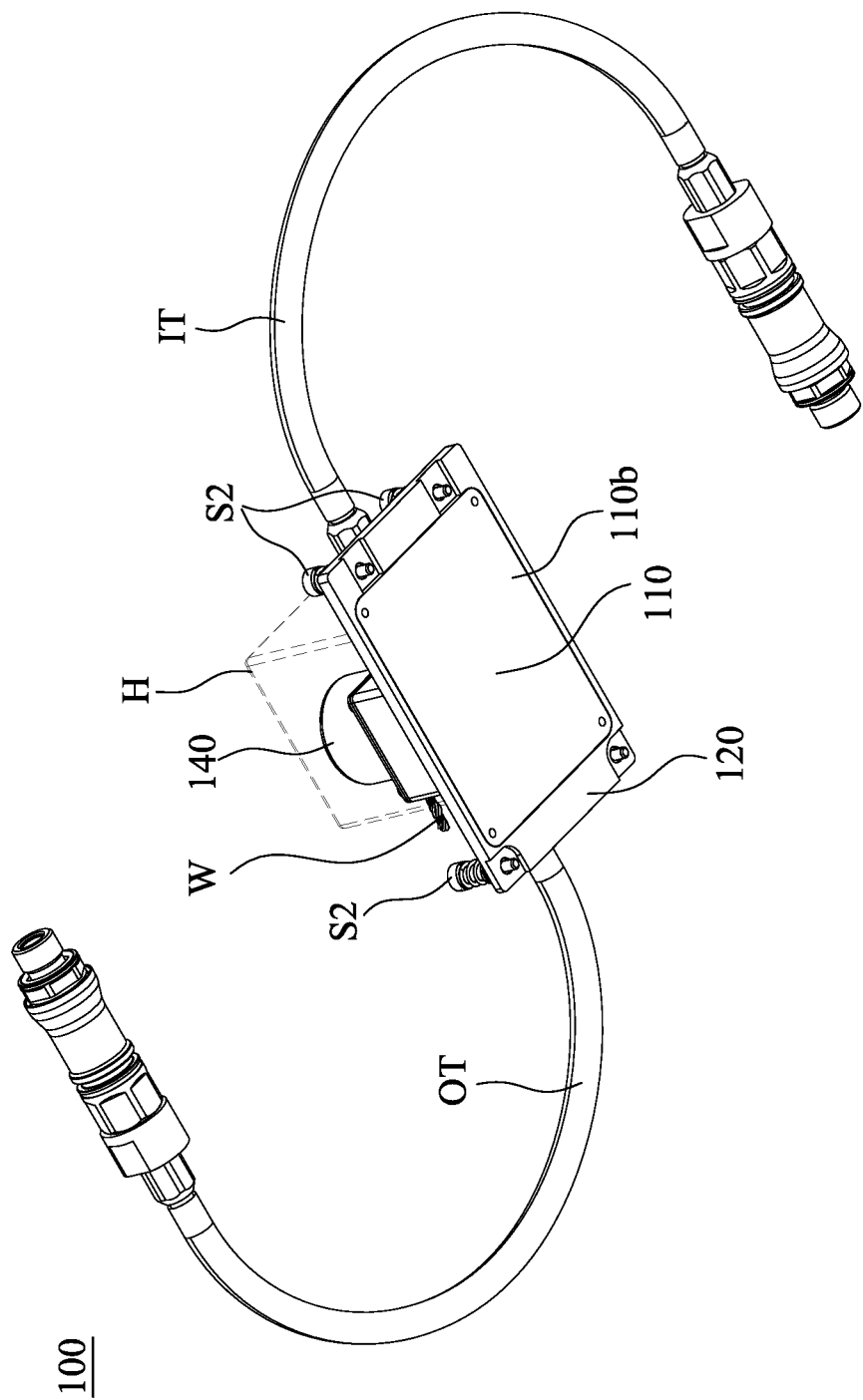
FIG. 2 shows another schematic view of a cooling liquid flow control device in accordance with an embodiment of present disclosure.

Reference is made to FIG. 1 and FIG. 2. FIG. 1 and FIG. 2 are schematic views of different viewing angles of the cooling liquid flow control device 100 according to an embodiment of the present disclosure. In this embodiment, the cooling liquid flow control device 100 includes a heat dissipation bottom plate 110, a fixing holder 120, a cooling module 130, and a temperature control element 140. The heat dissipation bottom plate 110 has a top surface 110a and a bottom surface 110b. The bottom surface 110b is configured to be in contact with a heating element (not shown; for example, a CPU) on a substrate (not shown; for example, a PCB). The fixing holder 120 is connected to the heat dissipation bottom plate 110 and configured to be fixed to the substrate. Specifically, as shown in FIG. 1 and FIG. 2, the heat dissipation bottom plate 110 is connected to the fixing holder 120 by the fixing element S1, the heating element is in contact with the bottom surface 110b of the heat dissipation bottom plate 110, and the heating element is located between the heat dissipation bottom plate 110 and the substrate. When the fixing holder 120 is fixed toward the substrate by the fixing element S2, the heat dissipation bottom plate 110 is pressed against the heating element. The cooling module 130 is connected to the top surface 110a of the heat dissipation bottom plate 110 to form a cavity. The cooling module 130 also includes a liquid inlet pipe IT and a liquid outlet pipe OT. The cavity is configured to circulate a cooling liquid. The temperature control element 140 is connected to the cooling module 130 and is configured to reciprocally move based on the temperature of the heating element, thereby adjusting the flow rate of the cooling liquid in and out of the cavity.

In some embodiments, as shown in FIG. 1 and FIG. 2, the cooling liquid flow control device 100 further includes a housing H. The housing H is configured to provide protection for the temperature control element 140.

In some embodiments, the cooling liquid flow control device 100 further includes a processing unit (not shown). The processing unit is configured to receive the temperature signal from the heating element. The processing unit is also configured to convert the signal into a current and output it to the temperature control element 140.

In some embodiments, as shown in FIG. 1 and FIG. 2, the cooling liquid flow control device 100 further includes a wire W. The wire W is configured to deliver the current from the processing unit to the temperature control element 140.

Figure 3:
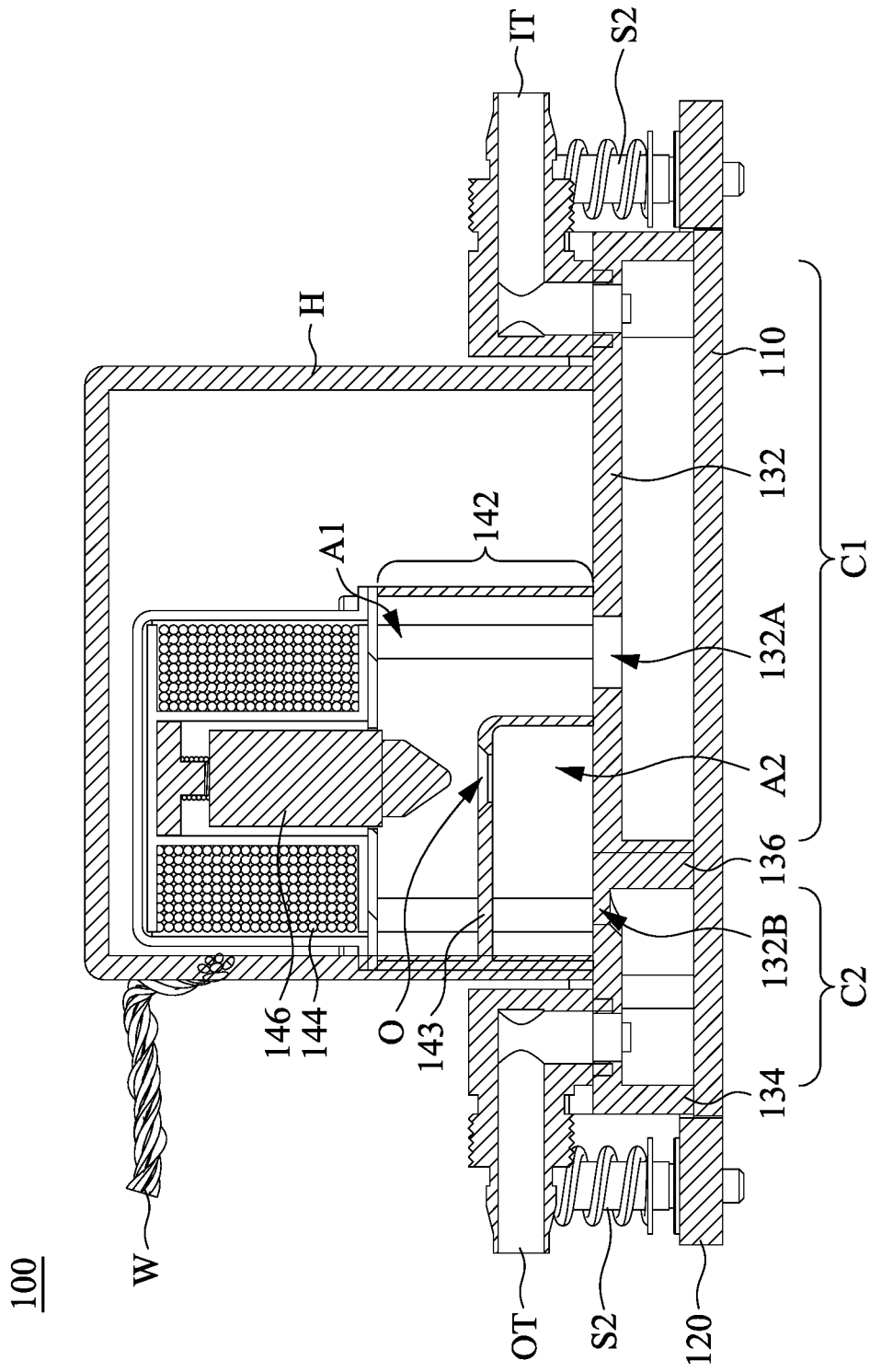
FIG. 3 shows a cross-sectional view of a cooling liquid flow control device in accordance with an embodiment of present disclosure.
Figure 4B:
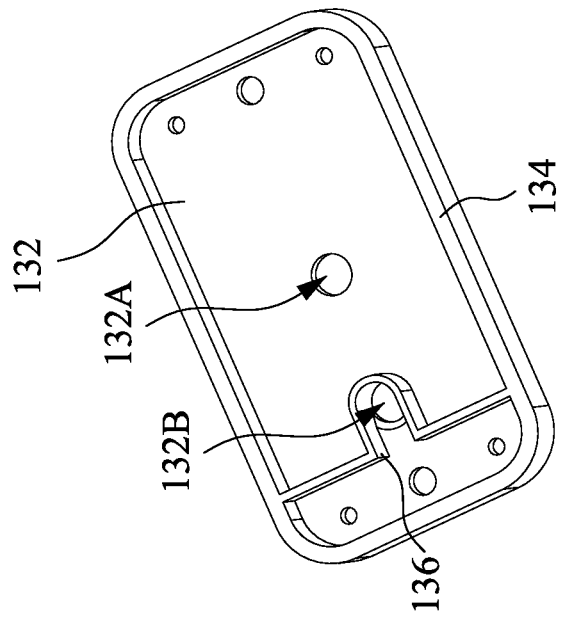
FIG. 4B shows another partial schematic view of the cooling module of the cooling liquid flow control device in accordance with an embodiment of present disclosure.
Figure 4A:
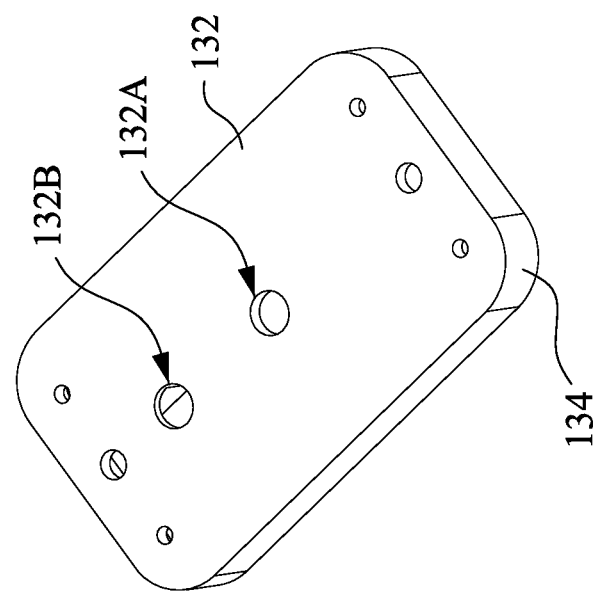
FIG. 4A shows a partial schematic view of a cooling module of a cooling liquid flow control device in accordance with an embodiment of present disclosure.

Please refer to FIG. 3, FIG. 4A, and FIG. 4B. In this embodiment, the cooling module 130 includes a top plate 132, a side wall 134, and a separating wall 136. The top plate 132 has a liquid inlet hole 132A and a liquid outlet hole 132B. The side wall 134 extends vertically from an edge of the top plate 132 and surrounds the edge of the top plate 132, in which the side wall 134 is connected to the heat dissipation bottom plate 110. The separating wall 136 extends vertically from the top plate 132 and is configured to divide the cavity into a first sub-cavity C1 and a second sub-cavity C2. That is, the separating wall 136 separates the first sub-cavity C1 and the second sub-cavity C2, in which the separating wall 136 is connected to the heat dissipation bottom plate 110. The first sub-cavity C1 is configured to receive the cooling liquid from the liquid inlet pipe IT. The second sub-cavity C2 is configured to deliver the cooling liquid from the first sub-cavity C1 to the liquid outlet pipe OT. In some embodiments, as shown in FIG. 3, the liquid inlet hole 132A is connected between the first sub-cavity C1 and the temperature control element 140, and the liquid outlet hole 132B is connected between the temperature control element 140 and the second sub-cavity C2.

Please refer to FIG. 3 and FIG. 5. In this embodiment, the temperature control element 140 includes a chamber body 142, a coil 144, and a valve 146. The chamber body 142 is configured to accommodate the cooling liquid from the first sub-cavity C1. The coil 144 is connected to the chamber body 142. The valve 146 is disposed in the coil 144. Specifically, the coil 144 including several wires surrounds the valve 146. In some embodiments, the valve 146 is disposed on an inner surface of the temperature control element 140. The valve 146 is configured to reciprocally move based on the temperature of the heating element, so as to adjust the flow rate of the cooling liquid in and out of the cavity.

Please continue to refer to FIG. 5. In this embodiment, the chamber body 142 further includes a liquid inlet area A1, a liquid outlet area A2, and a spacer 143. The liquid inlet area A1 is configured to receive the cooling liquid from the first sub-cavity C1. The liquid outlet area A2 is configured to deliver the cooling liquid from the liquid inlet area A1 to the second sub-cavity C2. The spacer 143 separates the liquid inlet area A1 from the liquid outlet area A2 and has an opening O. The opening O enables the cooling liquid to circulate between the liquid inlet area A1 and the liquid outlet area A2. In this embodiment, the valve 146 includes a static iron core 147, an elastomer 148, and a moving iron core 149. The static iron core 147 is fixed on the inner surface of the temperature control element 140. The elastomer 148 is connected between the static iron core 147 and the moving iron core 149. In some embodiments, the moving iron core 149 is configured to clog and be separated from the opening O. In some embodiments, an end of the moving iron core 149 may include a stop portion F, and the stop portion F is configured to clog and be separated from the opening O. In some embodiments, the temperature control element 140 further includes a pad P disposed between the coil 144 and the chamber body 142, and the pad P is configured to separate the coil 144 and the chamber body 142 to prevent the cooling liquid in the chamber body 142 from contacting the coil 144 to cause damage.

With the aforementioned structural configurations, when the cooling liquid flows into the first sub-cavity C1 from the liquid inlet pipe IT, the cooling liquid enters the liquid inlet area A1 through the liquid inlet hole 132A. Then, the cooling liquid flows into the liquid outlet area A2 through the opening O on the spacer 143. Then, the cooling liquid enters the second sub-cavity C2 through the liquid outlet hole 132B, and then flows into the liquid outlet pipe OT.

Next, the way the cooling liquid flow control device 100 controls the flow rate of the cooling liquid will be discussed below.

Figure 6:
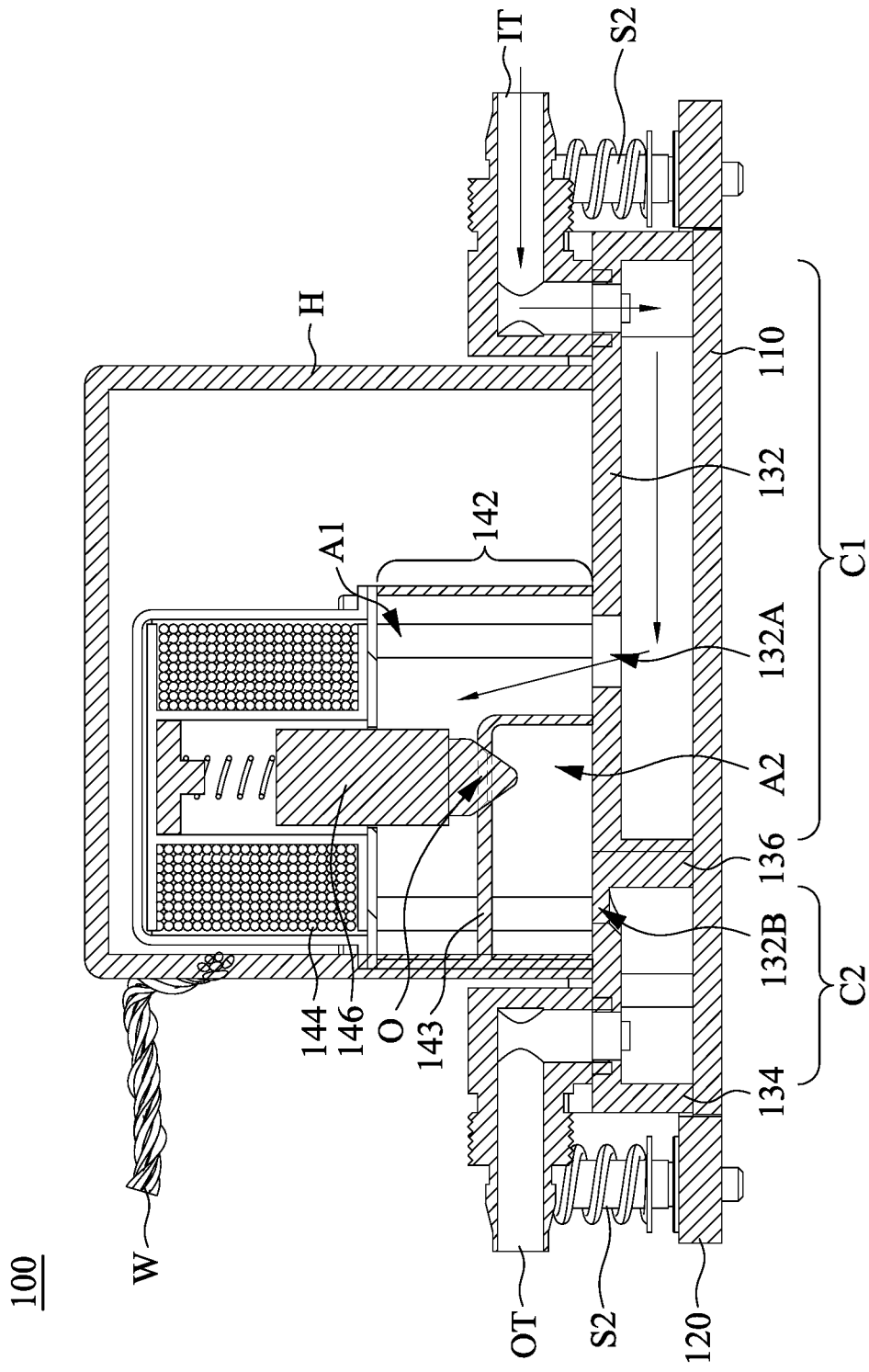
FIG. 6 shows a schematic view of a valve clogging an opening in accordance with an embodiment of present disclosure.
Figure 7:
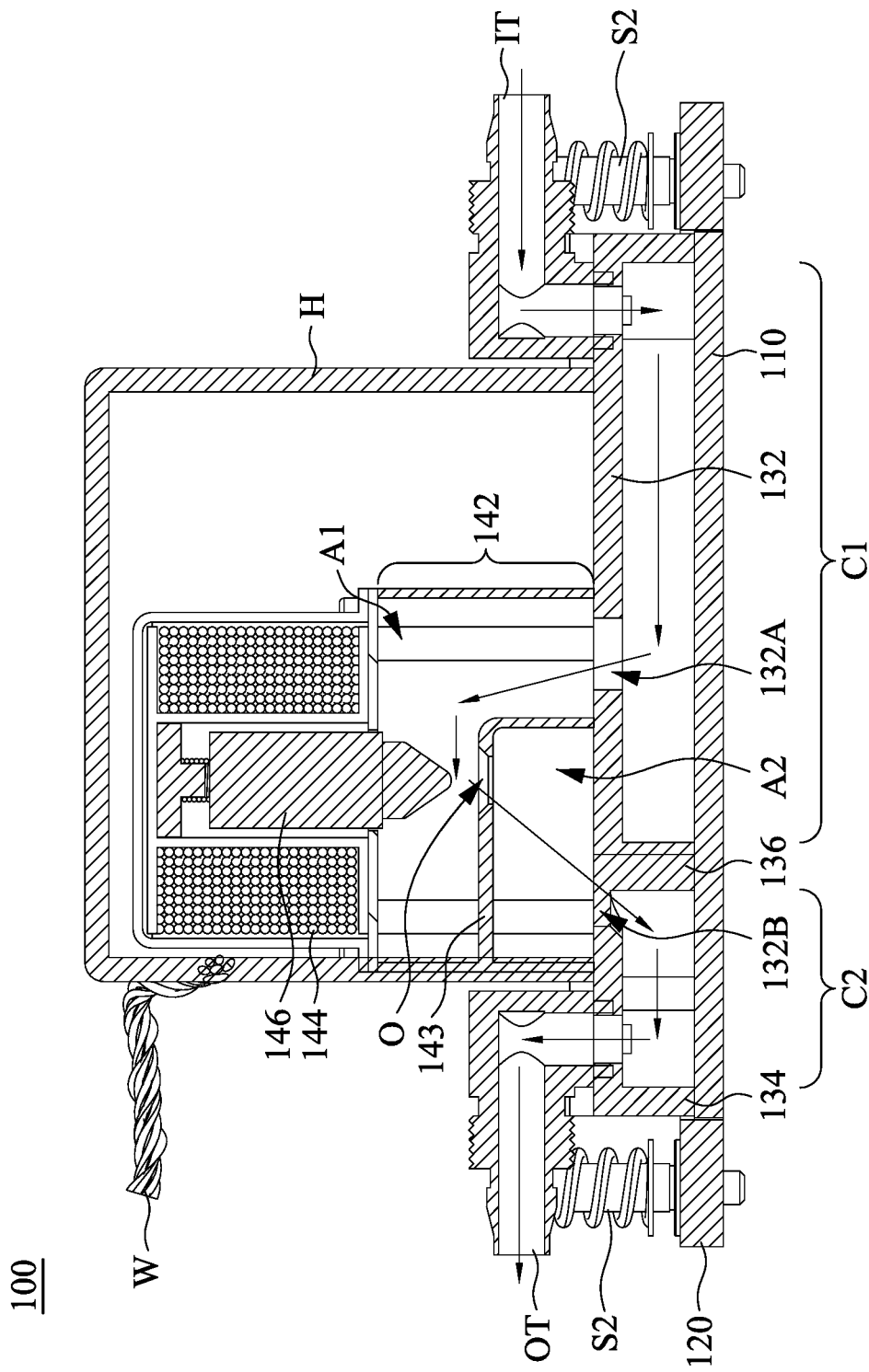
FIG. 7 shows a schematic view of the valve being separated from the opening in accordance with an embodiment of present disclosure.
Figure 8:
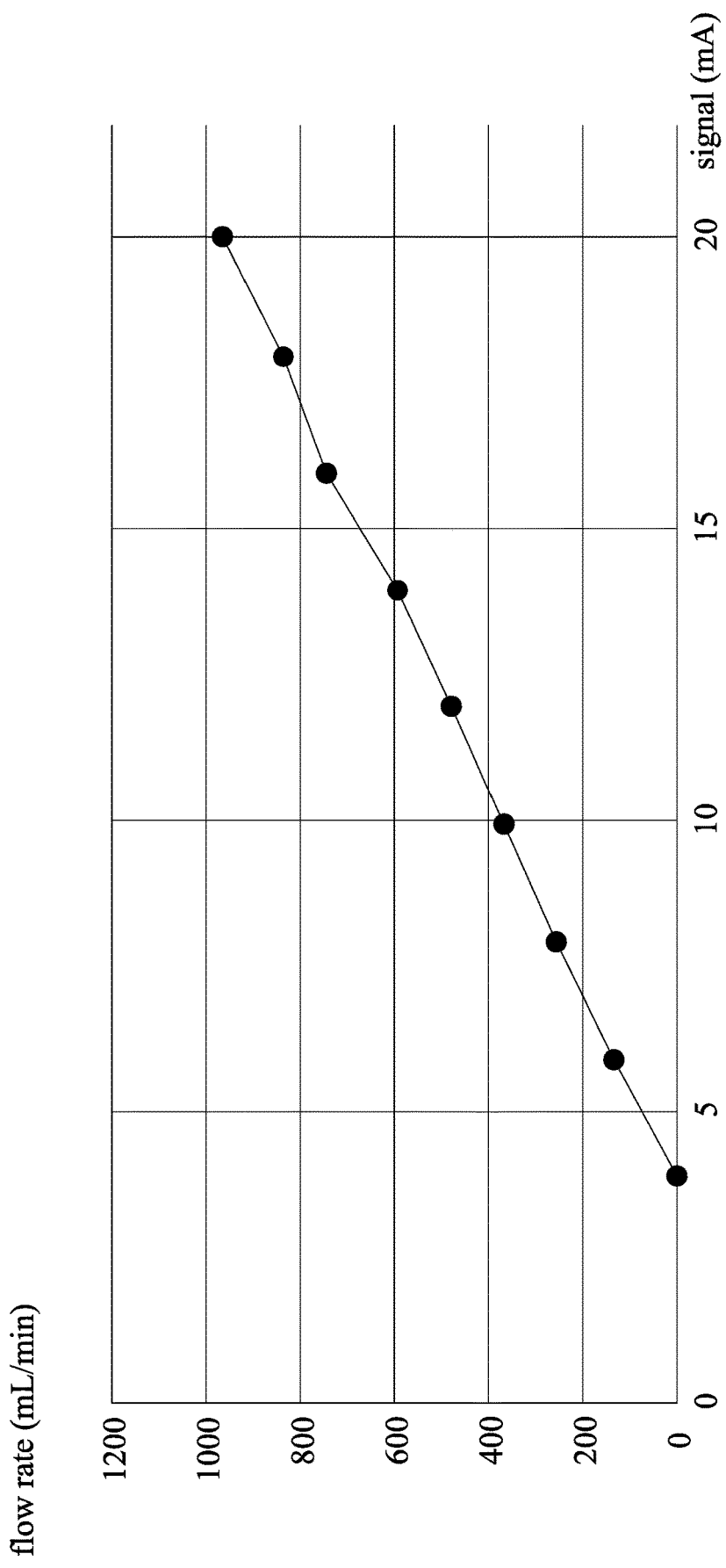
FIG. 8 shows a line graph of the relationship between a flow rate of a cooling liquid and a signal of a current in accordance with an embodiment of present disclosure.

Please refer to FIG. 6, FIG. 7, and FIG. 8. FIG. 6 and FIG. 7 show how the valve 146 of the temperature control element 140 operates to control the flow rate of the cooling liquid in the cooling liquid flow control device 100. FIG. 8 depicts the relationship between the flow rate of the cooling liquid and the signal of the current according to an embodiment of the present disclosure. In this embodiment, for example, the temperature of the heating element is obtained by the management chip (for example, Board Management Controller (BMC)) on the substrate, in which the management chip receives the signal. The processing unit acquires the temperature of the heating element by signal conversion through the management chip on the substrate. The processing unit converts the signal into a pulse width modulation (PWM) signal output through an internal software function, and linearly converts the PWM signal with a duty ratio of 0% to 100% into the current output ranging from 4 mA to 20 mA. In this way, the wire W can be used to control the reciprocating movement of the valve 146 to control the flow velocity or flow rate of the cooling liquid by receiving the current input. As shown in FIG. 8, the flow rate of the cooling liquid and the signal of the current are in a linear relationship. In some embodiments, the aforementioned current substantially displaces the moving iron core 149 to clog and be separated from the opening O, so as to achieve the effect of controlling the flow rate of the cooling liquid. When the heating element is in a normal operating state, the processing unit will output an appropriate current to the coil 144 so that the moving iron core 149 generates a displacement corresponding to the current to partially clog the opening O proportionally. Since the stop portion F clogs a part of the opening O, the cooling liquid from the liquid inlet pipe IT can enter the liquid outlet area A2 and the second sub-cavity C2 through the opening O at an appropriate flow rate.

In a usage scenario, when the heating element located under the heat dissipation bottom plate 110 and in contact with the bottom surface 110b does not generate waste heat due to being in an idle state, the processing unit does not output a current to the coil 144, and the moving iron core 149 does not generate an upward displacement (as shown in FIG. 6) and thus clogs the opening O by the stop portion F. Since the stop portion F clogs the entire opening O, the cooling liquid from the liquid inlet pipe IT cannot enter the liquid outlet area A2 through the opening O temporarily.

In a usage scenario, when the heating element located under the heat dissipation bottom plate 110 is in a full load state and generates a relatively large amount of waste heat, the processing unit outputs a corresponding maximum current to the coil 144 to enable the moving iron core 149 to generate an upward displacement (as shown in FIG. 7) so that the stop portion F is separated from the opening O. Since the stop portion F is separated from the opening O, the cooling liquid from the liquid inlet pipe IT can enter the liquid outlet area A2 through the opening O.

Through the above operations, the cooling liquid flow control device 100 can appropriately control the moving iron core 149 to clog, partially clog, and be separated from the opening O based on the temperature of the heating element through the corresponding current outputs, so as to achieve the effects of controlling the flow rate of the cooling liquid and saving energy.

In some embodiments, the stop portion F is disposed on the moving iron core 149, but the present disclosure is not limited thereto. In some embodiments, the moving iron core 149 may not include the stop portion F, but has an end having a pointed shape that matches the shape of the opening O, for example.

In some embodiments, the valve 146 includes a static iron core 147 and a moving iron core 149, but the present disclosure is not limited thereto. In some embodiments, the valve 146 may not include the static iron core 147 and the moving iron core 149 and may be formed as a unitary body. For example, the entire valve 146 is displaced downward and upward when the coil 144 receives the current from the processing unit.

In some embodiments, as shown in FIG. 1, FIG. 2, FIG. 6, and FIG. 7, the fixing element S2 includes elements such as springs and screws, but the present disclosure is not limited thereto. In some embodiments, the fixing element S2 may not include a spring. Although the present disclosure discloses that the fixing holder 120 is connected to the substrate by means of locking, the present disclosure does not intend to limit the structure, method, or means for connecting the fixing holder 120 to the substrate.

In some embodiments, as shown in FIG. 1, FIG. 2, FIG. 5, and FIG. 7, the fixing element S1 is substantially a screw. Although the present disclosure discloses that the heat dissipation bottom plate 110 and the fixing holder 120 are connected to each other by means of locking (for example, the heat dissipation bottom plate 110 and the fixing holder 120 are locked to each other through the fixing element S1), the present disclosure does not intend to limit the structure, method, or means for connecting the heat dissipation bottom plate 110 and the fixing holder 120 to each other.

In some embodiments, the composition of the cooling liquid may be liquid water ($H_2O$), but the present disclosure is not limited thereto. In some embodiments, the composition of the cooling liquid may be ethylene glycol ($C_2H_6O_2$) or propylene glycol ($C_3H_8O_2$). The above is merely an example for simple description, and the present disclosure does not intend to limit the composition of the cooling liquid.

In some embodiments, the heat dissipation bottom plate 110 and the cooling module 130 are substantially separated from each other, but the present disclosure is not limited thereto. In some embodiments, the heat dissipation bottom plate 110 and the cooling module 130 may be integrally formed rather than separately provided. For example, the heat dissipation bottom plate 110 and the cooling module 130 can be integrally formed into a water cooling case body with a cavity C.

In some embodiments, the heat dissipation bottom plate 110 and the cooling module 130 are substantially tightly connected. Alternatively, in some embodiments, the heat dissipation bottom plate 110 and the cooling module 130 may be adhesively connected to each other. Alternatively, in some embodiments, the heat dissipation bottom plate 110 and the cooling module 130 may be buckled and connected to each other. The foregoing is merely an example for simple description, and the present disclosure does not intend to limit the structure, method, or means for connecting the heat dissipation bottom plate 110 and the cooling module 130 to each other.

In some embodiments, the stop portion F may be a flexible material such as plastic, rubber, or cork to clog the liquid inlet hole 132A more tightly. The above is merely an example for simple description, and the present disclosure does not intend to limit the material of the stop portion F.

In some embodiments, the temperature control element 140 is disposed on the cooling module 130, but the present disclosure is not limited thereto. In some embodiments, for example, the temperature control element 140 may be disposed between the first sub-cavity C1 and the second sub-cavity C2. The present disclosure does not intend to limit the location of the temperature control element 140.

From the above detailed description of the specific embodiments of the present disclosure, it can be clearly seen that in the cooling liquid flow control device of the present disclosure, since the temperature control element utilizes the characteristic that the valve can reciprocally move based on the temperature of the heating element, the valve can clog, partially clog, or be separated from the opening to achieve the purpose of controlling the flow rate of the cooling liquid. In the cooling liquid flow control device of the present disclosure, since the flow rate of the cooling liquid that changes based on the displacement generated by the valve has a linear relationship with the current, the valve can proportionally clog the opening based on the temperature of the heating element. In this way, the energy saving effect of the cooling liquid flow control device can be achieved.

In an embodiment of the present disclosure, the cooling liquid flow control device of the present disclosure can be applied to a server, which can be used for artificial intelligence (AI) computing, edge computing, or used as a 5G server, cloud server or vehicle networking server.

Although the present disclosure has been disclosed as above in the embodiment manner, it is not intended to limit the present disclosure. Those skilled in the art can make various changes and modifications without departing from the spirit and scope of the present disclosure. Therefore, the scope of the present disclosure shall be subject to the scope of the attached claims.

What is claimed is:

1. A cooling liquid flow control device, comprising:
 a heat dissipation bottom plate having a bottom surface configured to be in contact with a heating element on a substrate;
 a holder connected to the heat dissipation bottom plate and configured to be fixed with the substrate;
 a cooling module comprising a liquid inlet pipe and a liquid outlet pipe with a cooling liquid flowing inside and connected to a top surface of the heat dissipation bottom plate to form a cavity, the cavity being configured to circulate the cooling liquid and further comprising:
  a first sub-cavity configured to receive the cooling liquid from the liquid inlet pipe; and
  a second sub-cavity configured to deliver the cooling liquid from the first sub-cavity to the liquid outlet pipe; and
 a temperature controller connected to the cooling module, comprising:
  a valve, the valve being configured to reciprocally move based on a temperature of the heating element, thereby adjusting a flow rate of the cooling liquid in and out of the cavity; and
  a chamber body configured to accommodate the cooling liquid from the first sub-cavity, and wherein the chamber body comprising:
   a liquid inlet area configured to receive the cooling liquid from the first sub-cavity;
   a liquid outlet area configured to deliver the cooling liquid from the liquid inlet area to the second sub-cavity; and
   a spacer separating the liquid inlet area and the liquid outlet area and having an opening to enable the cooling liquid to circulate between the liquid inlet area and the liquid outlet area,
  wherein the valve is configured to clog and be separated from the opening.

2. The cooling liquid flow control device of claim 1, wherein the cooling module further comprises:
 a top plate having a liquid inlet hole and a liquid outlet hole, wherein the liquid inlet hole is connected between the first sub-cavity and the temperature controller, and the liquid outlet hole is connected between the temperature controller and the second sub-cavity;
 a side wall extending vertically from an edge of the top plate and surrounding the edge of the top plate, wherein the side wall is connected to the heat dissipation bottom plate; and
 a separating wall extending vertically from the top plate and separating the first sub-cavity and the second sub-cavity, wherein the separating wall is connected to the heat dissipation bottom plate.

3. The cooling liquid flow control device of claim 2, wherein the temperature controller further comprises:
 a coil connected to the chamber body and surrounding the valve.

4. The cooling liquid flow control device of claim 3, further comprising a processing unit, the processing unit being configured to:
 receive a signal of the temperature of the heating element; and convert the signal to a current output to the coil, wherein the current causes a displacement of the valve.

5. The cooling liquid flow control device of claim 4, wherein the flow rate of the cooling liquid changes based on the displacement of the valve, and the flow rate and the current are in a linear relationship.

6. The cooling liquid flow control device of claim 4, wherein the valve is configured to:
   clog the opening so as not to communicate the liquid inlet area and the liquid outlet area when the heating element is in an idle state.

7. The cooling liquid flow control device of claim 4, wherein the temperature controller is configured to:
   be separated from the opening so as to communicate the liquid inlet area and the liquid outlet area when the heating element is in a load state.

* * * * *